United States Patent
Wang et al.

[11] Patent Number: 5,952,645
[45] Date of Patent: Sep. 14, 1999

[54] LIGHT-SENSING ARRAY WITH WEDGE-LIKE REFLECTIVE OPTICAL CONCENTRATORS

[75] Inventors: Yu Wang; Eric R. Fossum, both of La Crescenta, Calif.

[73] Assignee: California Institute of Technology, Pasadena, Calif.

[21] Appl. No.: 08/708,075

[22] Filed: Aug. 27, 1996

[51] Int. Cl.⁶ .................................................. H01L 27/00
[52] U.S. Cl. ...................................... 250/208.1; 257/436
[58] Field of Search .............................. 250/208.1, 208.2, 250/214 R, 214.1, 559.15; 257/292, 294, 434, 435, 436

[56] References Cited

U.S. PATENT DOCUMENTS

| | | |
|---|---|---|
| 3,660,736 | 5/1972 | Farasjo et al. . |
| 3,924,324 | 12/1975 | Kodera . |
| 4,429,192 | 1/1984 | Busch-Vishniac et al. . |
| 4,524,247 | 6/1985 | Lindenberger et al. . |
| 4,745,451 | 5/1988 | Webb et al. ............................ 257/436 |
| 4,764,690 | 8/1988 | Murphy et al. . |
| 4,910,840 | 3/1990 | Sprenkels et al. . |
| 5,055,667 | 10/1991 | Sayag .................................. 250/208.1 |
| 5,352,886 | 10/1994 | Kane .................................. 250/208.2 |
| 5,408,731 | 4/1995 | Berggvist et al. . |
| 5,471,515 | 11/1995 | Fossum et al. ......................... 259/239 |
| 5,604,607 | 2/1997 | Mirzaoff ............................... 250/208.1 |

FOREIGN PATENT DOCUMENTS 970884  7/1975  Canada .

Primary Examiner—Edward P. Westin
Assistant Examiner—Kevin Pyo
Attorney, Agent, or Firm—Fish & Richardson P.C.

[57] ABSTRACT

Wedge-shaped optical reflectors are used to reflect optical energy. Certain optical energy is incoming toward an area of the chip that is housing the non-photosensitive electronics. Wedges are used to reflect that radiation toward the photosensitive electronics.

18 Claims, 6 Drawing Sheets

LIGHT-SENSING ARRAY WITH WEDGE-LIKE REFLECTIVE OPTICAL CONCENTRATORS

FIELD OF THE INVENTION

The present invention describes control of channeling of light in a pixel-sensing device.

BACKGROUND AND SUMMARY

Active Pixel Sensor ("APS") technology represents a second generation image sensor technology. An Active Pixel Sensor includes image acquiring structure, including an amplifier, in each pixel.

Each pixel has a limited light gathering capability that is proportional to the size of the light gathering structure. However, this image acquiring structure has previously taken up some of the otherwise availible area, or "real estate" on the image sensor substrate, "the chip". The so-called "fill factor" is a measure of how much of the chip is used to gather incoming light. Fill factor is degraded by this associated image acquiring structure. The fill factor of active pixel sensors has been as low as 20 to 30 percent.

One possible solution to this problem is the use of microlenses, such as described in co-pending patent applications, e.g. Ser. No. 08/558,521. Microlenses have been used in an attempt to refract some of the light impinging on the active pixel sensor to a photoreactive location. For example, if the light impinges on an area of the real estate that holds the amplifier, that light may be refracted to the area of the photosensitive element.

However, the inventors noticed problems with using the microlenses.

The shape of the microlens is very difficult to control. Rays having large incident angles may be shifted to the neighboring pixels by the microlenses. The inventors hence found that introducing the microlenses may increase the crosstalk and noise level.

FIG. 1 illustrates this occurrence. A ray 100 off the optical axis of photogate A is shown being reflected at the air/microlens interface. A portion 102 of that incoming ray enters the neighboring microlens B, thereby increasing crosstalk and noise level.

For example, a ray at 60 degrees off the normal incidence may have over 10% reflected at the air/microlens interface to generate the crosstalk. Moreover, about 20% of the s-polarized light will be reflected and create crosstalk, while only less than 1% of p-polarized light is reflected. This may be unacceptable for certain applications.

The inventors recognized the need for a different technique of channeling light to a desired area on a light sensitive device. The preferred technique of the present invention uses light channelling without lensing effects to avoid this problem.

The preferred system uses small sized wedge-shaped reflectors ("micro wedge reflectors") to accomplish this goal. These reflectors can increase the photon collection efficiency without generating crosstalk.

The micro-wedge reflectors preferably cover the area of the associated image structure of the APS. This channels many of the image photons into the photosensitive areas, to thereby enhance the photon collection efficiency.

Another aspect of the invention limits the photons to movement in one direction. This further decreases the crosstalk.

For small pixel sizes close to the diffraction limit, for example, microlenses may not work. All lenses have inherent properties. For example, a lens cannot focus more distinctly than its diffraction limit. A lens also cannot focus to achieve resolution beyond what the respective space-bandwidth product will allow. The quality of a lens is usually inversely proportional to its cost. This has provided a lower limit on the size of pixels that can be used with microlenses.

The wedge reflectors of the present invention are reflective, not focusing, structures. Hence, there is no limits on size or resolution.

The micro-wedge structure described herein is based on the inventor's recognition of the crosstalk and other drawbacks with microlenses. This structure uses the reflection effect to avoid the undesired refraction effect. This structure may allow better efficiency than the microlens. It can be precisely fabricated by micro-fabrication technology, it can work well for very small pixels, and there is smaller ray shifting for large incident angle rays. Since substantially all of the photons are limited to redirection in one direction, the crosstalk can be minimized.

BRIEF DESCRIPTION OF THE DRAWINGS

These and other aspects of the invention will now be described in detail with reference to the accompanying drawings, wherein.

DESCRIPTION OF THE PREFERRED EMBODIMENTS

Figure 2:
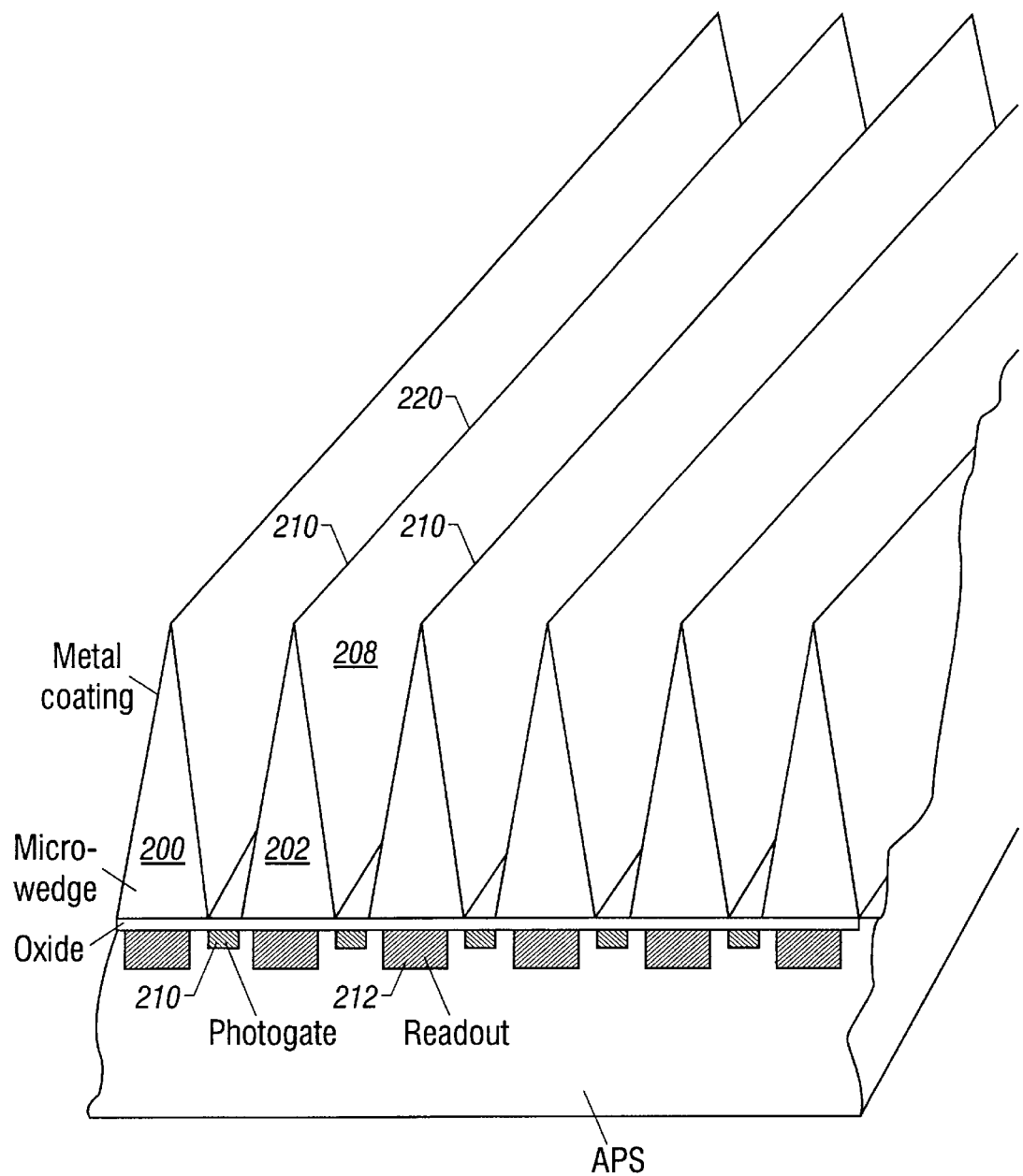
FIG. 2 shows a preferred embodiment of the present invention using reflective micro-wedges.

The active pixel sensor chip includes two distinct areas in each pixel. Referring to FIG. 2, the photosensitive area of each chip includes a photogate 210 which collects and integrates the light that is incident on the surface area of the photogate. Readout circuit 212 includes the associated amplifier and other electrical structures which are associated with each readout area. Only that light which is incident on the photogate 210 is collected; light that is not incident on the photogate is not sensed. The light that is incident on the area of the readout circuit 212, therefore, is not sensed. That readout circuit 212, therefore, occupies real estate on the chip that cannot be used for light integration.

FIG. 2 shows the first embodiment of the light channelling structures. Those structures are formed by reflective micro-wedges 200, 202. The micro-wedges each include two light-reflecting surfaces 208, 210 which face in directions generally opposed to one another. The two light-reflecting surfaces 208, 210 meet at angled area 220.

Figure 3:
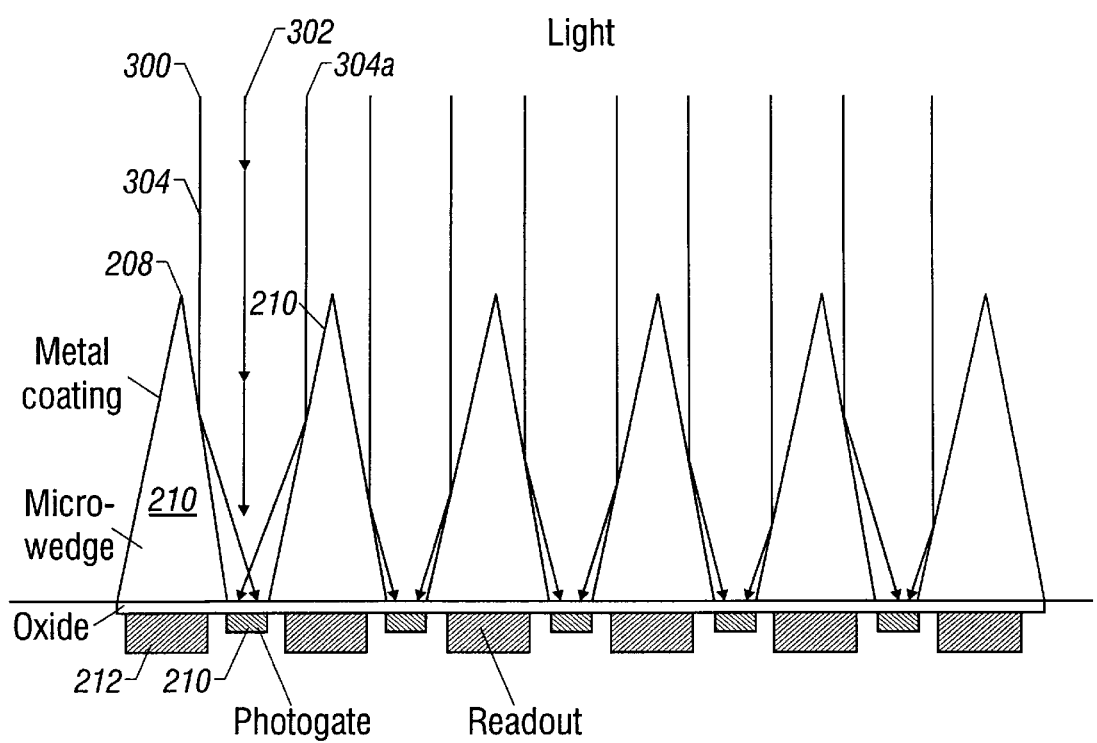
FIG. 3 shows how the FIG. 2 micro-wedges are used on a pixel device.

The reflection operation of these coatings operate as shown in FIG. 3.

Incident image light 300 incident on the device includes a first portion 302 which will naturally impinge on the photogate area 210, and a second portion 304 which would, if unreflected, impinge on the readout areas 212. The photons in the first portion 304 which would fall outside of the photogate areas are directed onto the photogate 210 by the reflection of the micro-wedge surfaces 208, 210. For example, light ray 304 is reflected at point 306 to be incident on photogate 210. In this way, many of those photons which impinge from outside the photogate area can be collected by reflection. This allows a more efficient collection of incident light.

The preferred embodiment uses a high-reflection metal coating of 500–1000 Å in thickness on the micro-wedge surfaces 208, 210. Higher reflectivities provide a higher photon collection efficiency. However, less expensive techniques, including white coloring of the surfaces can be used with less optical efficiency traded off against the higher cost.

The micro-wedges used according to the present invention can be used with any radiation that is capable of being reflected. The preferred radiation bands include ultraviolet, visible and infrared.

Figure 4:
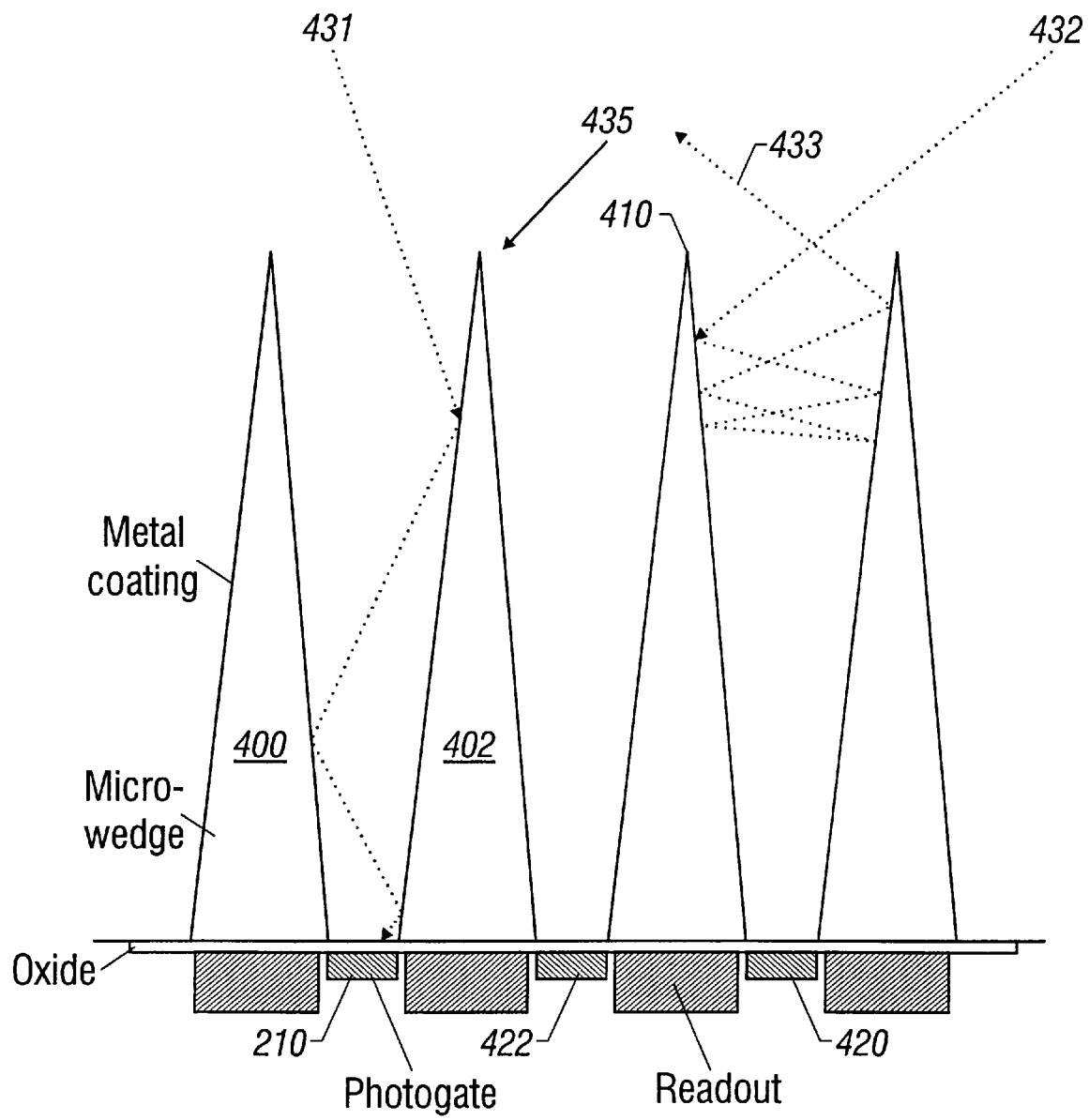
FIG. 4 shows operation of high-profile reflectors with large incident angle radiation.

The lateral aspect ratio of this reflective micro-wedge is dependent on the height/width ratio of these wedges. This ratio preferably ranges between 1:1 to 5:1. A ratio which is high enough, e.g., greater than 3.5:1 can collect photons with large incident angles, as shown in FIG. 4.

Ray 431 with a large reflective surfaces of the incident angle will be reflected several times between the two micro-wedges 400, 402 before reaching the photogate area 210. Even rays at extremely high incident angles, like ray 432, will be reflected many times between two wedges and finally either reach the photogate or be reflected back toward the incident direction as ray 433. High incident angle rays can become problematic in microlenses as described above. Those rays that are at high incidence angles can be refracted by the microlens to the wrong pixel. This pixel crosstalk can create smearing in the detected image.

The wedge reflectors of the present invention include edge-defining surfaces 410, 412. These edges define boundary edges between for the pixel. The ray 432 impinging on the pixel 420 side of boundary 410 is intended for pixel 420. The ray 435, on the other hand, impinges on the other side of the boundary 410 and hence is intended for the pixel 422. Theses edge defining surfaces hence demarcate the areas where the incoming radiation will be reflected.

Figure 5A:
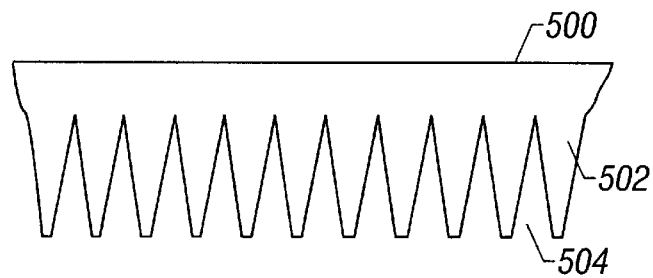
FIG. 5A shows a cross section of a second embodiment of the present invention.
Figure 5B:
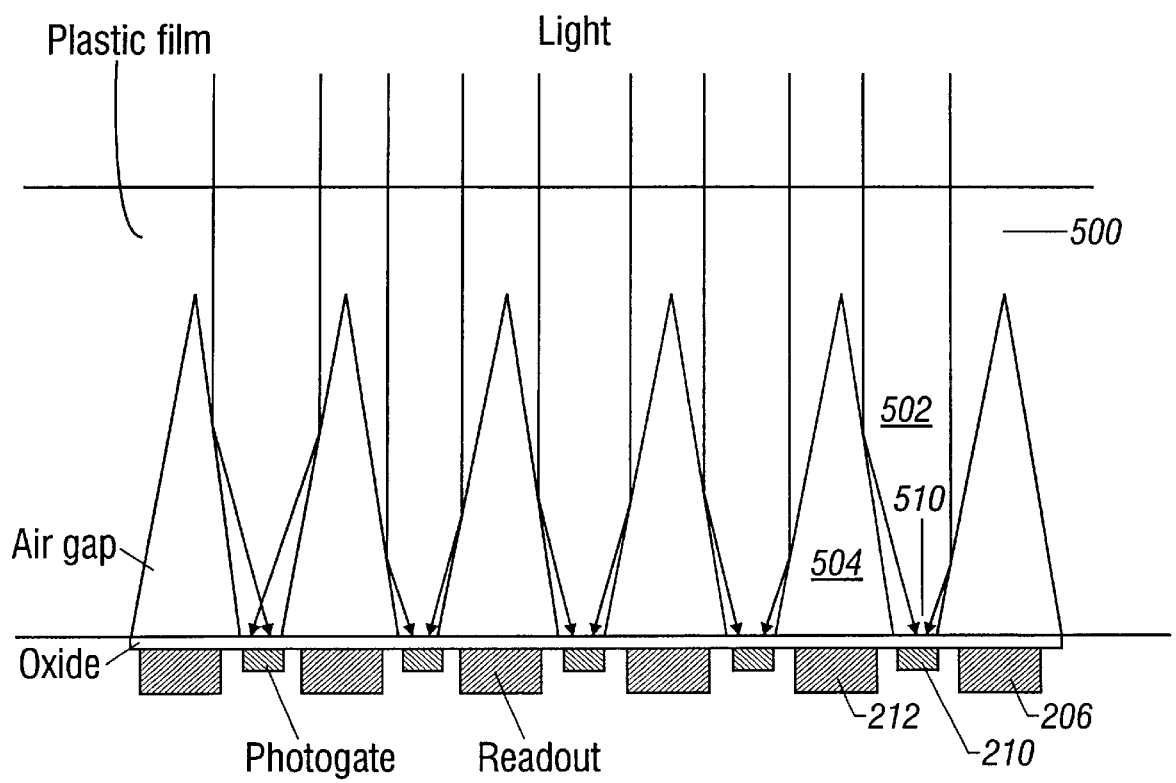
FIG. 5B shows that second embodiment of the invention used with a pixel device.

A second embodiment of the radiation-reflecting devices of the present invention is shown in FIGS. 5A and 5B. FIG. 5A is the cross section of an internally-reflecting plastic film used to according to the second embodiment. The film is preferably a polyamide film with the wedges described herein formed as microstructures thereon. The light receiving side of the film 500 is intended to receive incoming beams. The reflecting side 502 includes a number of wedge-shaped air gaps 504.

FIG. 5B shows the plastic film 500 placed over the APS chip 206 in the preferred way.

The film 500 is mounted such that each photogate area 210 is connected to or physically coupled to a lower end portion 510 of the plastic part 502 of film 500. The air gaps 504 are located to cover the readout circuits 212. These rays do not reach the neighboring pixels to generate crosstalk.

When the image light is incident on the plastic film, the photons moving toward the readout area are reflected by the plastic-air interface of the wedge-shaped air gap by total internal reflection to impinge on the photogate area. This embodiment is susceptible of being formed by semiconductor formation techniques, and hence this design is well suited for mass production. Moreover, proper selection of materials can make this photon collection efficiency even better than the micro-wedge reflector, if the total internal reflection is more efficient than reflection from metal coating. This selection process would be understood by a person having ordinary skill in the art.

In order to effectively collect all of the image photons, the lateral ratio of these micro-wedges should be at least 2:1. Higher ratios may provide a larger photon collection angle. Recently, a micro-fabrication technology called LIGA (a German acronym for Lithographic, Galvanoformung, Abformung—in English, lithography, electroforming, molding) has been reported to form tall structures with submicrometer resolution. The structures have large vertical aspect ratios —lateral dimensions of a few micrometers and vertical dimension up to 1000 $\mu$m. Metal-coated silicon tips with dimension of 1 $\mu$m wide and 3 $\mu$m high also have also been reported. This process is preferably used to make the micro-wedges and the micro-wedge air gap plastic films.

Figure 1:
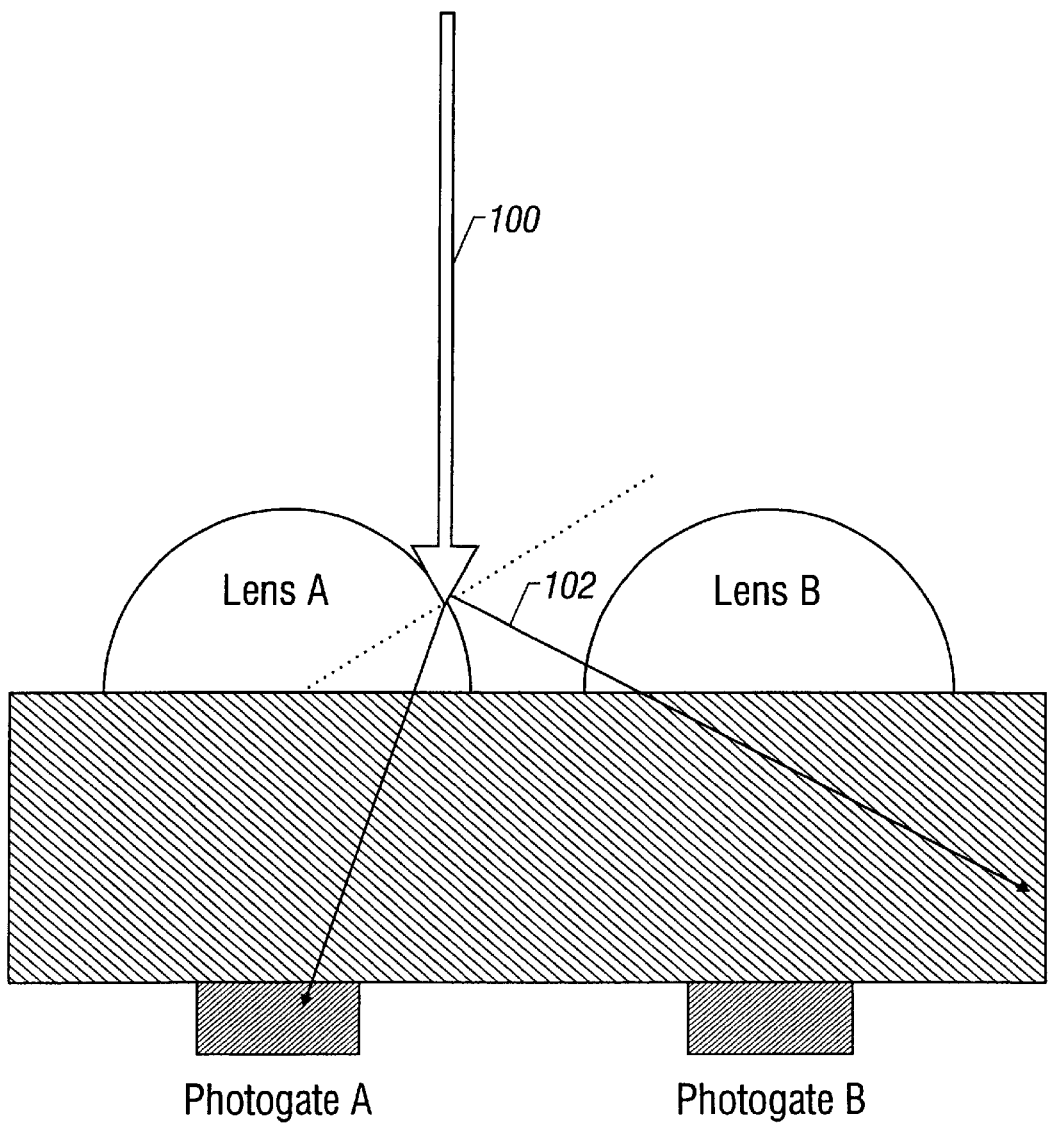
FIG. 1 shows how reflection from refracting microlenses can cause crosstalk among the pixels.
Figure 6:
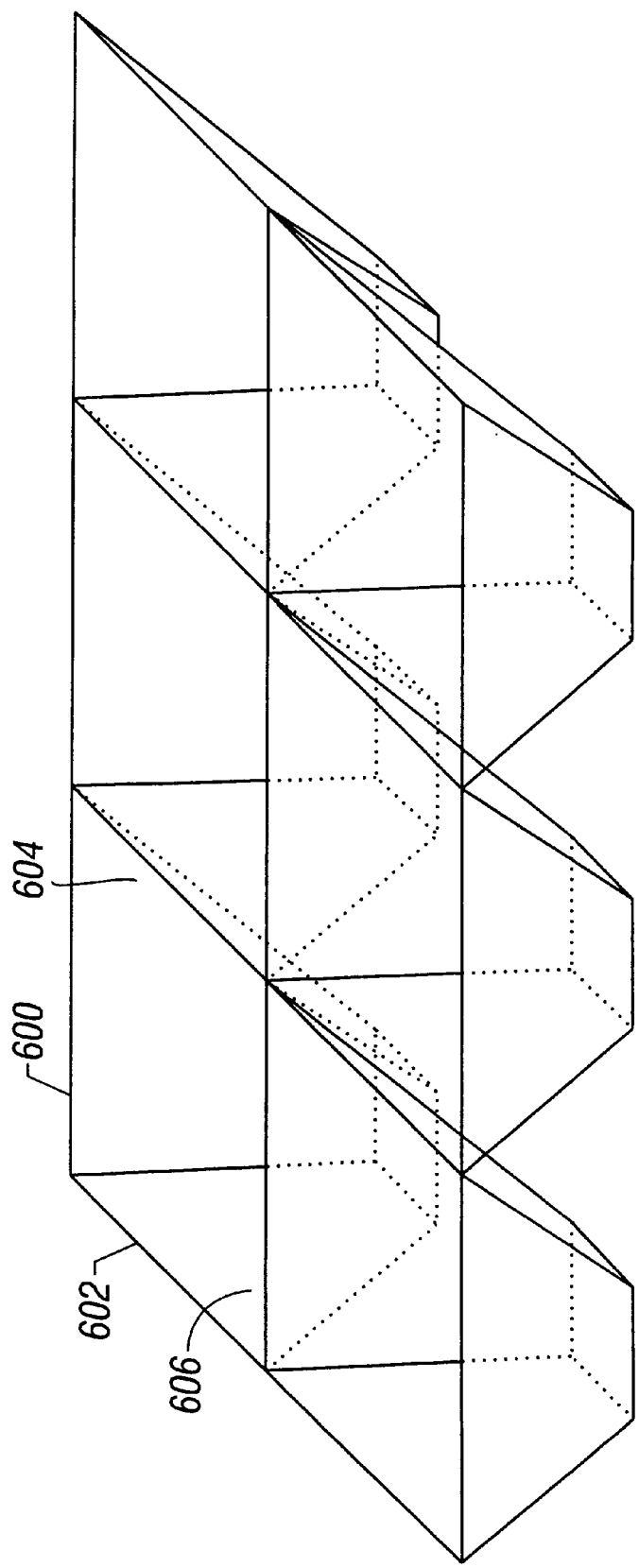
FIG. 6 shows a two-dimensional wedge structure.

A third embodiment modifies either of the above two embodiments to make a two dimensional micro-wedge well as shown in FIG. 6. The two dimensional embodiment in the FIG. 6 is shown as a plastic reflector, but the structure can also operate with reflectively lined micro-wedges of the FIG. 1 embodiment.

The two dimensional system includes edges 600, 602, 604, 606 which define edges of pixel area. All of the photons falling into the well between these edges will end up at the photogate area. This device will have even higher light collection efficiency and less crosstalk.

Although only a few embodiments have been described in detail above, those having ordinary skill in the art will certainly understand that many modifications are possible in the preferred embodiment without departing from the teachings thereof.

For example, the surface of the micro-wedges do not have to be planar in shape. A curved surface could also work for desired applications.

The materials described herein, of course, are susceptable of modification.

All such modifications are intended to be encompassed within the following claims.

What is claimed is:

1. An optical detector, comprising:

an image receiving surface formed on a semiconductor substrate, including at least a photosensitive area and an adjacent non-photosensitive area and operating to receive light incident upon said detector from the side of said imaging receiving surface; and a light collecting element formed over said image receiving surface relative to said photosensitive area and said non-photosensitive area and configured to couple said incident light to said image receiving surface by reflection and to enhance a light-collecting efficiency of said photosensitive area and imaging resolution without a lensing operation or an operation of total internal reflection, wherein said light collecting element includes at least two light reflecting surfaces, adjacent said photosensitive area and each forming an acute angle with respect to a normal direction of said image receiving surface, said light reflecting surfaces operable to reflect at least a portion of light which would otherwise impinge on said non-photosensitive area towards the photosensitive area, wherein said two light reflecting surfaces are configured to reflect certain light rays that are incident towards said image receiving surface at an incident angle larger than a prespecified incident angle away from said image receiving surface.

2. A detector as in claim 1 wherein said photosensitive area includes a photogate and said non-photosensitive area includes an area of the substrate integrating an amplifier associated with the photogate.

3. A photodetector, comprising:

a substrate, including a sensing surface which has a first photosensitive area and a second non-photosensitive area; and a reflective element formed on said sensing surface and located in a location to reflect at least a portion of incident radiant energy incident to said substrate from said sensing surface side that would otherwise impinge on said second area to said first area, without a lensing operation or an operation of total internal reflection, wherein said reflective element is configured to reflect certain light rays that are incident towards said sensing surface at an incident angle larger than a prespecified incident angle away from said sensing surface.

4. A photodetector as in claim 3, wherein said substrate includes an active pixel sensor.

5. A method of acquiring radiation over an area, comprising:

positioning a radiation sensitive element formed on a receiving surface of a semiconductor substrate to receive radiation; and using at least one reflective surface of a wedge-like structure having a plurality of reflective surfaces and formed on said receiving surface to reflect at least a part of the radiation that is incident in a direction where said part would not impinge on said radiation sensitive element, toward said radiation sensitive element, without a lensing operation or an operation of total internal reflection, using at least two of said reflective surfaces to operate in combination to reflect certain light rays that are incident towards said receiving surface at an incident angle larger than a prespecified incident angle away from said receiving surface.

6. An optical detector, comprising:

a semiconductor substrate having a first side and a second opposite side, said first side having a sensing surface configured to receive radiation incident to said substrate from said first side;

a plurality of detector pixels formed on said sensing surface as a sensing array, each detector pixel including a radiation-sensitive area and a non-radiation-sensitive area; and a light coupling array formed on said sensing surface atop of said detector pixels and comprised of a plurality of micro-wedges having straight edges that form radiation-receiving openings to continuously connect to one another without gaps so that any radiation ray incident to said light coupling array is received by one of said radiation-receiving openings, wherein each micro-wedge has a base and at least two reflective surfaces that respectively intersect said base to form an acute angle with respect to a normal direction of said base and is positioned relative to said radiation-sensitive area so that said reflecting surfaces direct at least a portion of said radiation incident from said first side that would otherwise impinge non-radiation-sensitive areas to respective radiation-sensitive areas, without a lensing operation.

7. A detector as in claim 6, wherein each said micro-wedge is formed on top of a respective non-radiation-sensitive area by at least partially overlapping said base with said respective non-radiation area and two adjacent micro-wedges are displaced from each other to expose a respective radiation-sensitive area to said first side of said substrate.

8. A detector as in claim 7, wherein said reflective surfaces are coated with a radiation-reflective material.

9. A detector as in claim 6, wherein said micro-wedges are configured to have a specified ratio of a height over a width of said base so as to reflect certain radiation rays, that are incident towards said sensing surface from said first side at an incident angle larger than a prespecified incident angle, away from said sensing surface.

10. A detector as in claim 6, wherein each micro-wedge is formed of a material that is at least partially transparent to said radiation and is located on top of a respective radiation-sensitive area and a facet opposing said base of said micro-wedge covers said respective radiation-sensitive area so that said reflective surfaces of said micro-wedge direct at least a portion of radiation rays entering said micro-wedge from said base onto said respective radiation-sensitive area.

11. A detector as in claim 10, wherein bases of two adjacent micro-wedges are in contact with each other.

12. A detector as in claim 10, wherein each micro-wedge is configured so that said reflective surfaces reflect at least a portion of said radiation rays entering from said base by total internal reflection.

13. A detector as in claim 6, wherein each photosensitive area includes a photogate and the respective non-photosensitive area includes an area of said substrate integrating an amplifier associated with said photogate.

14. A detector as in claim 6, wherein said two light reflecting surfaces are configured to reflect certain light rays that are incident towards said sensing surface at an incident angle larger than a prespecified incident angle away from said sensing surface.

15. An optical detector, comprising:

a sensing array of detector pixels formed on a semiconductor substrate and operable to convert photons into electrical signals, each detector pixel including a radiation-sensitive area and a non-radiation-sensitive area; and a light coupling array formed over said detector pixels and comprised of a plurality of coupling elements having straight edges that form radiation-receiving openings to continuously connect to one another without gaps so that any radiation ray incident to said light coupling array is received by one of said radiation-receiving openings, each coupling element having at least two reflective surfaces and positioned relative to said radiation-sensitive area so that said reflecting surfaces direct at least a portion of incident radiation that would otherwise impinge non-radiation-sensitive areas to respective radiation-sensitive areas, wherein said two light reflecting surfaces in each coupling element are configured to reflect certain light rays that are incident towards said sensing array at an incident angle larger than a prespecified incident angle away from said sensing array.

16. A detector as in claim 15, wherein one reflective surface of one coupling element intercepts another reflective surface of an adjacent coupling element so as to cover at least one non-radiation-sensitive area of one detector pixel.

17. A detector as in claim 15, wherein said reflective surfaces are curved.

18. A detector as in claim 15, wherein said detector pixels are active sensing pixels and each non-photosensitive area includes an amplifier.

* * * * *